United States Patent [19]
Hamburgen et al.

[11] Patent Number: 5,629,840
[45] Date of Patent: May 13, 1997

[54] HIGH POWERED DIE WITH BUS BARS

[75] Inventors: William R. Hamburgen, Palo Alto; John S. Fitch, Newark; Norman P. Jouppi, Palo Alto, all of Calif.

[73] Assignee: Digital Equipment Corporation, Maynard, Mass.

[21] Appl. No.: 218,877

[22] Filed: Mar. 28, 1994

Related U.S. Application Data

[63] Continuation of Ser. No. 883,544, May 15, 1992, abandoned.

[51] Int. Cl.$^6$ ............................ H05K 7/02; H01L 23/02; H01L 23/48
[52] U.S. Cl. ................ 361/820; 174/52.4; 257/678; 257/691; 361/761; 361/775
[58] Field of Search ................... 174/52.1, 52.2, 174/52.3, 52.4; 257/666, 668, 659, 692, 678, 691, 693, 695, 700, 734, 735, 736, 758, 759, 760; 361/760–764, 772, 775, 777, 779, 792; 439/68, 70, 71, 72; 437/207–209

[56] References Cited

U.S. PATENT DOCUMENTS

| | | | |
|---|---|---|---|
| 4,320,438 | 3/1982 | Ibrahim et al. | 361/401 |
| 4,514,749 | 4/1985 | Shoji | 257/659 |
| 4,860,165 | 8/1989 | Cassinelli | 361/792 |
| 4,966,226 | 10/1990 | Hamburgen . | |
| 4,995,451 | 2/1991 | Hamburgen . | |
| 5,006,963 | 4/1991 | Spangler et al. | 361/807 |
| 5,036,163 | 7/1991 | Spielberger et al. | 174/52.4 |
| 5,311,058 | 5/1994 | Smelley | 257/692 |

FOREIGN PATENT DOCUMENTS

| | | | |
|---|---|---|---|
| 3-60050 | 3/1991 | Japan | 257/734 |
| 3-222442 | 10/1991 | Japan | 361/764 |

OTHER PUBLICATIONS

Satch, et al., "A 209K Transistor ELL Gate Array With Ram", IEEE Journal of Solid–State Circuits, vol. 24, No. 5, Oct. 1989.

Fitch, John S. et al; "Microchannel Wafer Cooling Chuck", Ser. No. 07/722,891, Filed Jun. 28, 1991.

Hamburgen, William R. et al, "Fixture and Method for Attaching Components", Ser. No. 07/722,972, Filed Jun. 28, 1991.

Hamburgen, William; "Die Attach Structure and Method", Ser. No. 07/417,730; Filed Oct. 5, 1989.

Hamburgen, William; "Die Attach Structure and Method", Ser. No. 07/628,944, Filed Dec. 14, 1990.

Hamburgen, William; "Hollow Chip Package and Method of Manufacturing", Ser. No. 07/725,376, Filed Jun. 27, 1991.

Hamburgen, William; "Semiconductor Package and Method of Wraparound Metalization", Ser. No. 07/542,179, Filed Jun. 22, 1990.

Hamburgen, William; "Integrated Circuit Test Fixture and Method", Ser. No 07/546,523, Filed Jun. 29, 1990.

Hamburgen, William; "Gentle Package Extraction Tool and Method", Ser. No. 07/722,656, Filed Jun. 28, 1991.

*Primary Examiner*—Leo P. Picard
*Assistant Examiner*—Donald A. Sparks
*Attorney, Agent, or Firm*—Denis G. Maloney; Arthur W. Fisher

[57] ABSTRACT

Power bus bars are provided for a semiconductor die. Power bus bars are thick electrical conductors that extend the length of the die in an electrically isolated array of stripes. The electrical stripes are divided into two or more interdigitated groups, each group connected to a power supply, or connected to a ground supply. This arrangement of alternate power and ground stripes minimizes inductance and resistance, and brings power and ground close to every transistor in the semiconductor die with minimized voltage variations.

3 Claims, 5 Drawing Sheets

HIGH POWERED DIE WITH BUS BARS

This application is a continuation of application Ser. No. 07/883,544, filed May 15, 1992 now abandoned.

BRIEF DESCRIPTION OF THE INVENTION

This invention generally relates to packages for semiconductors. This invention more particularly relates to a package with a number of novel features to accommodate a high powered die.

BACKGROUND OF THE INVENTION

Electronic devices commonly include a number of chips to perform a set of functions. These multichip arrangements are subject to inter-chip signaling delays which increase the basic machine cycle time. Multichip modules can partially mitigate this problem. However, multichip modules are complex and expensive.

Efforts are ongoing to include more and more system functions on a single die. As device feature sizes shrink to 1.0 micrometer or less, and die sizes increase to over 1 cm$^2$, it becomes possible to put an entire processor, including floating point unit, memory management, and cache memory, on a single CMOS (complementary metal-oxide semiconductor) die. Examples of this fully integrated approach include most of today's fastest microprocessors, including Digital's 21064 RISC microprocessor and Intel's i486. This fully integrated approach is slowly being applied to mainframe computers.

Modern mainframe computers typically rely upon emitter coupled logic (ECL). ECL is a very fast logic family with superior load driving capabilities. However, in its usual gate array or standard cell form, ECL has a lower layout density than custom CMOS. In addition, ECL has high static power dissipation. For instance, a high performance ECL microprocessor will dissipate over 100 W. For proper performance, the package should uniformly distribute 30 amps and maintain the die at less than 100° C. The size and high watt density of such a chip precludes conventional power distribution strategies. Similarly, acoustic noise considerations preclude the use of conventional solid metal heatsinks. Thus, even single-chip packaging presents a considerable challenge, particularly in power distribution and cooling.

The cooling mechanisms for ECL dies must address a number of problems. As previously stated, conventional solid metal heatsinks are not feasible. However, one prior art technique which may be helpful in cooling an ECL die is a thermosiphon. A thermosiphon absorbs heat by vaporizing liquid on a boiling surface and transferring the vapor to a condenser where it cools and reliquifies. Gravity then returns the liquid to the boiler to repeat the cycle.

In order for a thermosiphon to successfully cool an ECL die, a number of problems with prior art devices must be solved. One shortcoming with prior art devices is that additional thermal interfaces are used between the die and the thermosiphon. The thermal interfaces add manufacturing complexity and compromise efficient heat transfer from the die.

The choice of operating fluid within the thermosiphon significantly affects the thermosiphon performance. Water is a desirable working fluid for a thermosiphon since it has such a high heat of vaporization, high thermal conductivity, and is nontoxic and nonflammable. However, at subatmospheric pressures and at high heat fluxes, the boiling behavior of water becomes sporadic. Thus, it would be desirable to improve the boiling behavior of the fluid within the thermosiphon while still employing a fluid which is non-toxic and non-flammable.

Thermosiphon performance is also compromised by contaminants which may migrate into the fluid. Contaminants typically enter the fluid from joint regions of the thermosiphon. It would be advantageous to eliminate this problem.

A final problem with prior art thermosiphons relates to the control of excess temperatures. A mechanism should be provided which prevents the thermosiphon from exploding if it is exposed to fire or some other high temperature fault condition.

There are numerous power distribution problems associated with ECL dies. ECL dies require large currents while maintaining tight voltage tolerances. In particular, a high performance ECL microprocessor will typically require 30 amps. The same chip will typically have a signal swing of approximately 600 mV. In contrast, a CMOS chip will have a signal swing of approximately 3.3 V.

Special design considerations are required to assure highly uniform voltages at all circuit locations. In addition, the packaging should accommodate power transients caused by switching activity in the circuits and signal wires. Power transients may significantly disrupt chip performance.

The power distribution problems for an ECL microprocessor are especially acute in relation to the bond wires coupling the chip to the package. Most microprocessors, and other VLSI devices, employ aluminum wires with a diameter of approximately 33 micrometers. Aluminum has a melting point of approximately 660° C. This melting point limits the current per wire to approximately 200 mA. Thus, to provide the 30 amps required for an ECL microprocessor die would require 300 aluminum bond wires for the power alone. This is unacceptably high because a microprocessor will require approximately 350 signal wires and approximately 150 power wires. Thus, a modified bond wire configuration is required.

The problem with the high number of bond wires is compounded by the fact that 33 micrometer diameter wires generally require a pitch (i.e., distance between wire bond pads) of at least 100 micrometers. To increase bondwire density, other designers have tried staggering the pads around the edge of the die. While this approach can accommodate wider bonding tools and bonds, it increases wire-to-wire shorting risks. This problem is especially acute with multi-tier packages which have poor tier-to-tier registration. A multi-tier package is desirable for a high density chip such as a microprocessor. Wedge bonding is the technique typically employed in multi-tier packages. The problem with wedge bonding is that the shallow wire departure angle at the first row of bond pads requires a relatively large spacing to the next row of bond pads to alleviate the potential for shorting. This approach makes the wires longer and consumes valuable die space. It would be advantageous to develop a multi-tier package which employs relatively short bond wires which can carry relatively large currents, and simultaneously be space efficient.

OBJECTS AND SUMMARY OF THE INVENTION

It is a general object of the present invention to provide an efficient package for a high powered die.

It is a more particular object of the invention to provide a high powered die package which includes an improved thermosiphon.

It is a related object of the invention to reduce the number of thermal interfaces between the die and the thermosiphon.

It is another object of the invention to provide an improved operating fluid which boils at a lower temperature with reduced temperature oscillations.

It is another object of the invention to provide a thermosiphon with joints which do not leak or seal contaminants into the thermosiphon.

It is another object of the invention to provide a thermosiphon which accommodates temperature fault conditions within the thermosiphon.

It is still another object of the invention to provide uniform voltages to all locations of a high powered die.

It is yet another object of the invention to provide a mechanism for reducing the detrimental effect which power transients have on a die.

It is another object of the invention to provide bond wires for carrying large currents to the high powered die.

It is another object of the invention to provide a multi-tier package without wedge bonding.

These and other objects are obtained by a novel package for a high powered die. The package includes a number of features for alleviating the unique thermal build up and power distribution problems associated with high powered dies. The package includes a novel thermosiphon. The thermosiphon includes a fuse for accommodating temperature fault conditions. The thermosiphon utilizes a water and alcohol mixture for improved boiling characteristics. Contaminants at the joint between the thermosiphon and the package housing are reduced by the use of a shrink ring seal. Thermal interfaces between the die and the thermosiphon are eliminated by directly coupling the die to the thermosiphon. Uniform voltage levels are delivered to the die by novel bus bars. Voltage transients are absorbed by capacitors closely positioned to the power bond pads. Ball bonding is used for the gold bond wires used in the package. The package's multi-tier housing does not require staggered bond pads on the die.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
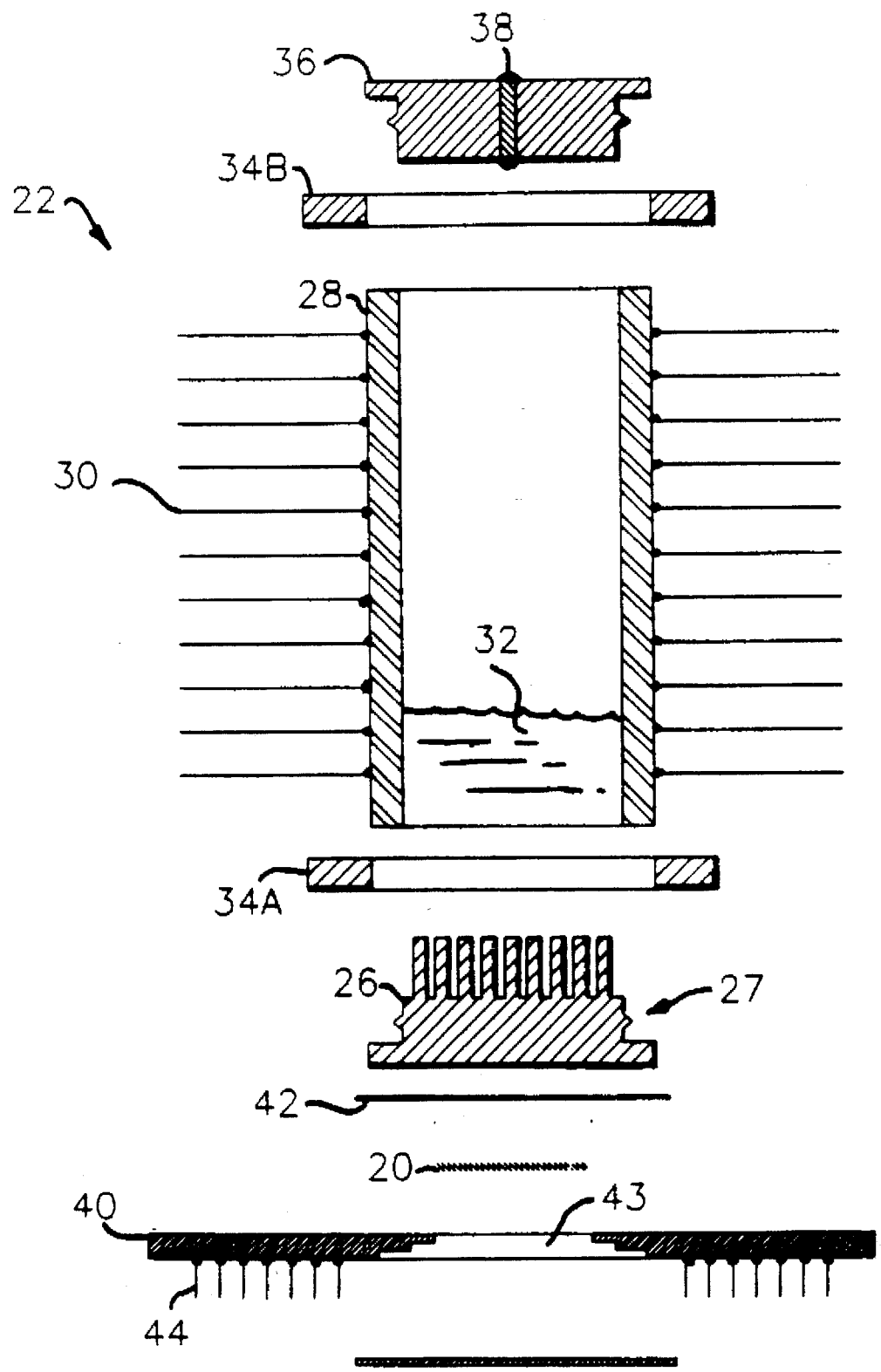
FIG. 1 is an exploded view of the high powered die package of the invention.

Referring to FIG. 1, a high powered die 20 is depicted in relation to its package 22. The top portion of the package includes a thermosiphon 24. At the base of the thermosiphon is a boiler 26. Positioned above the boiler is a condenser 28, which includes a plurality of fins 30 along its outer perimeter. The thermosiphon 24 encloses a fluid 32. The thermosiphon 24 may employ a conventional boiler 26, condenser 28, and fins 30. For instance, the boiler 26 may be nickel-plated copper. The condenser 28 may be formed of copper tubing which is approximately 12 cm long with a diameter of approximately 3.0 cm. The fins 30 may be copper spirally wrapped and brazed onto the tube. The fins 30 may have an outside diameter of 5.4 cm and a pitch of 4 fins per cm.

While the boiler 26, condenser 28, and fins 30 may be of a conventional form, the fluid 32 is preferably an alcohol-water mixture. The choice of operating fluid significantly affects thermosiphon performance. Water is a desirable working fluid for a thermosiphon to the extent that it has a high heat of vaporization, high thermal conductivity, and is nontoxic and nonflammable. However, at subatmospheric pressures and at high heat fluxes, the boiling behavior of water becomes sporadic.

In accordance with the invention, a small amount of alcohol is added to water to alter the surface tension and thermodynamic conditions of the thermosiphon fluid 32 so as to promote steady boiling and improve the overall performance. In particular, in a preferable embodiment, a mixture of 22% propanol in water, by volume, is used. More generally, the percentage of alcohol by volume is preferably between 5 and 30%. Other volatile organic fluids may be substituted. The thermosiphon fluid 32 of the invention enhances performance is non-toxic, and is not considered flammable or combustible by standards established by the Department of Transportation.

Figure 2:
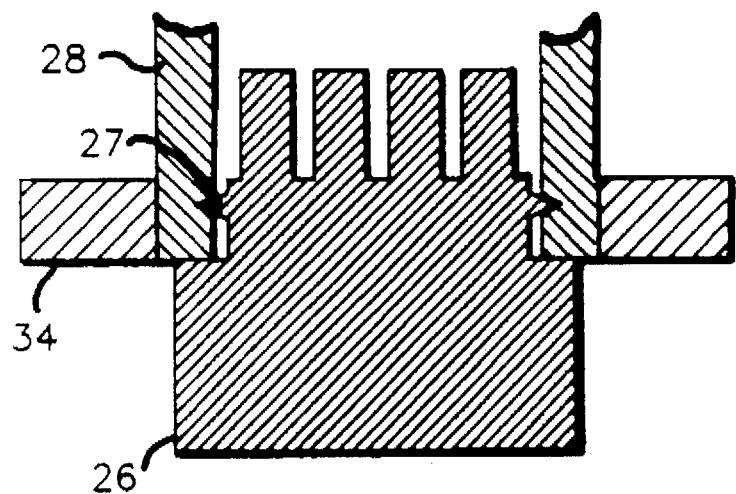
FIG. 2 is a detailed view of the shrink ring for coupling the thermosiphon to the boiler.

The condenser 28 is coupled to the boiler 26 by a shrink ring 34A. The nature of this connection is more fully disclosed in relation to FIG. 2. The prior art approach to achieving this connection is to solder or braze the two pieces together. The problem with this approach is that soldering may introduce contaminants into the fluid 32. Contaminants seriously degrade the performance of a thermosiphon. For instance, scale on the hot regions of the thermosiphon can hinder boiling performance, ionics can cause corrosion, and noncondensable gases can gather in the cooled end, blanketing the condenser surface.

In order to avoid trapping solder fluxes or additional materials in the thermosiphon, the present invention employs an intrinsically clean sealing technique. The copper tube of the condenser 28 is hermetically sealed onto the boiler 26 by a shape memory ring 34A, or shrink ring. The shape memory ring may be a nickel-titanium alloy ring which shrinks by approximately 5% in diameter when heated. Raychem Corporation sells shape memory alloys which shrink 5% when heated to approximately 183° C. The shrinking squeezes the condenser 28 onto a small protruding region, or sealing land 27 on the outside diameter of the boiler 26.

An identical connection is made at the top of the condenser with a cap 36. The cap 36 may be formed of nickel-plated copper and preferably includes a thermal fuse 38. In particular, a hole is drilled through cad 36 and is then filled with a low temperature solder or other fusible material. In the event that the thermosiphon is exposed to a fire or some other high temperature fault condition, the solder melts and releases the internal pressure before an explosion occurs.

Each of the elements of the thermosiphon 24 is now described. The following assembly procedure may be used for the thermosiphon. First, the boiler 26 is attached to the condenser 28 with shrink ring 34A. Fluid 32 is then added to condenser 28. The die 20 which is attached to the boiler 26, as will be described below, is then powered to boil and degas the fluid 32. One skilled in the art will recognize that other heat sources may be used or that a vacuum may be applied to initiate boiling. At a desired fill volume (approximately 20%) and at a desired alcohol-water mixture (approximately 22% alcohol by volume), the cap 36 is sealed in place with shrink ring 34B. Sealing the condenser 28 while the fluid 32 is boiling ensures a saturated state inside the thermosiphon 24. This minimizes the internal operating pressure, and hence operating temperature.

Unlike prior art devices which employ a copper slug or other thermal interface between the die 20 and the thermosiphon 24, the package of the present invention directly couples the die 20 and the thermosiphon 24. In this configuration, the boiler 26 serves as the slug.

Thus, in accordance with the efficient thermal design philosophy of the present invention, all thermal interfaces between the die 20 and the thermosiphon 24 are eliminated, except the die attach. The approach of the present invention reduces the number of thermal interfaces, but it requires that the thermosiphon condenser be assembled after the die is attached and wire bonded into the housing, as will be described below. In the prior art a conventional package slug is used, which results in a higher die temperature and an additional assembly process.

The die 20 and the housing 40 may be simultaneously attached to the boiler 26 using a thin low-elastic-modulus epoxy 42. A commercially available epoxy preform such as, Ablestik ECF563, sold by Ablestik Corporation, may be used. This unsupported silver-filled epoxy preform offers high thermal conductivity, a low elastic modulus and adequate adhesion. Using preforms eliminates the need to develop paste dispensing programs. However, other adhesives may also be used such as electrically nonconductive epoxies, solders, or plastics.

Since the epoxy is electrically conductive, the entire thermosiphon 24 is connected to the same voltage potential as the backside of the die 20. The thermosiphon 24 should be covered by a plastic shroud to protect service personnel. Dielectric materials, such as ceramics, may be used for the boiler or for isolation layers on the boiler/epoxy interface. This allows the condenser to be grounded, but at the cost of higher die operating temperatures.

A more detailed description of the die attach process follows. First, the die 20 is placed in the package cavity 43. An epoxy preform 42 is placed on boiler 26. The housing 40 is then placed onto fixture locating devices and lowered onto the epoxy 42. To distribute the pressure evenly across the die 20, preferably an elastomer pad (not shown) with a Kapton polyimide film backing is used. The Kapton polyimide layer ensures that the gold bond pads on the die are not contaminated. The elastomer pad may be bonded to a steel backing plate (not shown) that is guided by the pins 44 of the housing 40. This accurately locates the pad to the die. A spring mechanism may be used on the backing plate through a steel ball bonded to the center of the backing plate. The ball assures that during cure, the load remains accurately centered and perpendicular to the die. By changing springs, the pressure on either the die or the housing-to-boiler joint can be independently adjusted about a 400 kPa nominal value. The fixed assembly is then heated to approximately 130° C. for approximately two hours to cure the epoxy.

The housing 40 is preferably a plastic pin grid array. Preferably, the power pins are evenly dispersed throughout the pin field to spread heat and to improve signal integrity. In one embodiment of the invention, there are 83 $V_{cc}$ (ground) pins, 61 $V_{ee}$ pins and 12 $V_{tt}$ (terminating voltage) pins. The $V_{ee}$ pins are most heavily loaded, but with a 30 A supply, each pin averages only 0.49 A.

Thus, a number of packaging techniques for cooling high powered dies are disclosed. In particular, a reduction of thermal interfaces between the die and the thermosiphon is disclosed. In addition, an improved operating fluid for use within the thermosiphon is disclosed. A clean seal which reduces migration of toxics into the thermosiphon is also disclosed. Finally, a mechanism for accommodating temperature fault conditions is also disclosed. Attention now turns to the power distribution techniques associated with the high powered die package of the invention.

Figure 3:
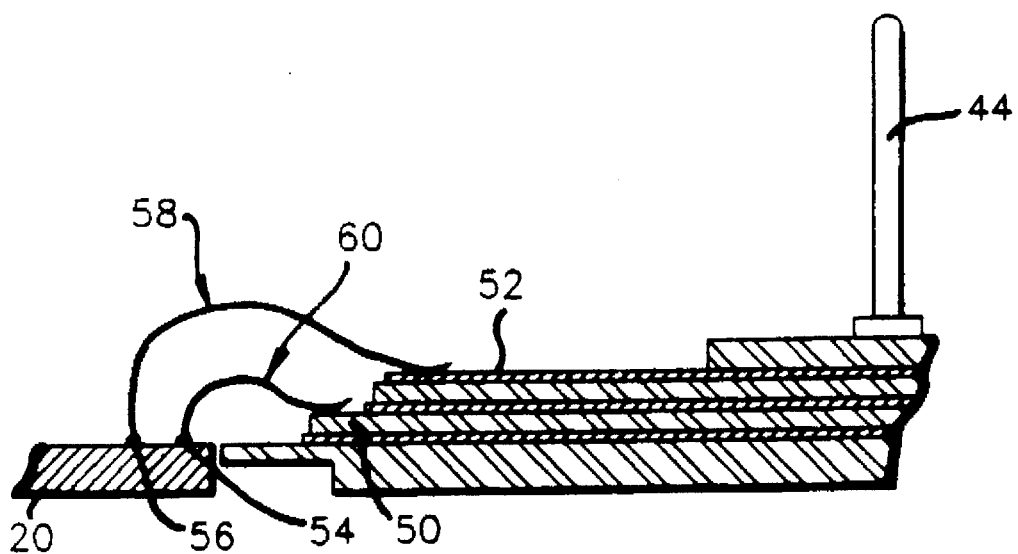
FIG. 3 is a side view of the gold bond-balled bond wires utilized in the invention.
Figure 4:
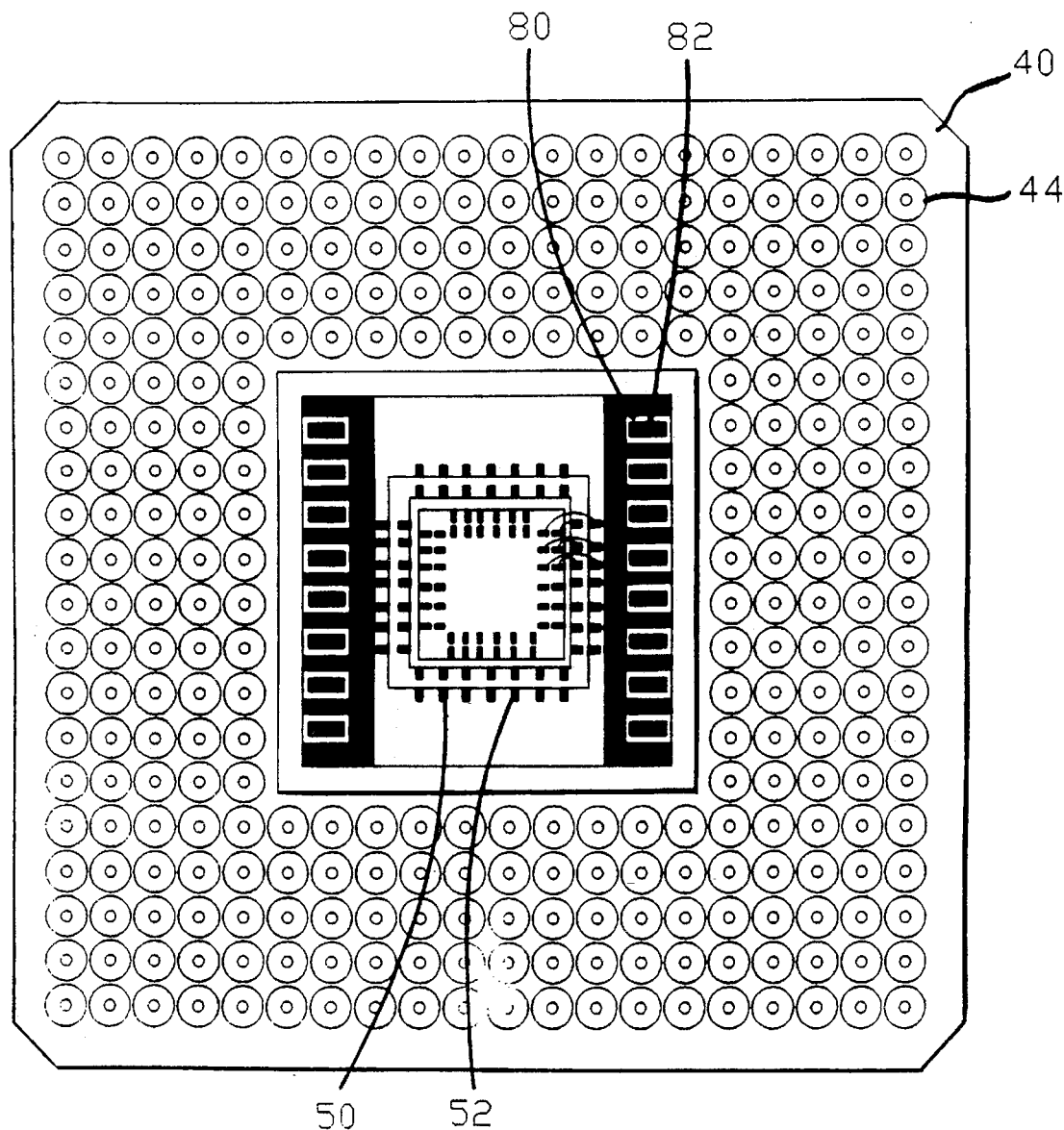
FIG. 4 is a bottom view of the high powered die package of the invention.

FIGS. 3 and 4 depict the bondwiring scheme which is used in accordance with the invention. The package of the invention utilizes a multi-tier structure including a signal tier 50 and a power tier 52, as used herein, the tiers may also be referred to as bond shelves. The die 20 preferably has its signal pads 54 on the outer perimeter and its power pads 56 inside the signal pads 54. The signal pads 54 may be relatively close to the power pads 56 because ball bonding is used, instead of wedge bonding which requires more space between the rows of pads. Gold bond wires are used to accommodate the higher currents associated with the high powered die 20.

As depicted in FIG. 3, the wires are bonded in two completely separate arrays. Signal wires 54 go only to the signal tier 50 and power wires go only to the power tier 52. This approach simplifies inspection and repair after the signal tier is bonded.

Provided there is sufficient control of wire looping, this methodology also allows the pitches of the two rows to be completely independent. In one embodiment of the invention, power bond wires 58 with a diameter of 46 micrometers are used and signal bond wires 60 with a diameter of 32 micrometers are used. The power wires are approximately 3.0 mm long. The power bond pads have a 177.8 micrometer pitch to accommodate large power wires. Using a diameter to pitch ratio of 1:3.85, a 46 micrometer diameter wire can be used. The signal pads have a 152.4 micrometer pitch.

The gold ball bonds of the invention have a relatively large vertical departure angle, so they do not incur a row spacing penalty, as with wedge boding approaches in the prior art. In fact with gold ball bonding, looping heights can be controlled sufficiently so that staggering the pads on the die 20 is unnecessary. The prior art employs staggered die pads when using wedge bonding.

Figure 5:
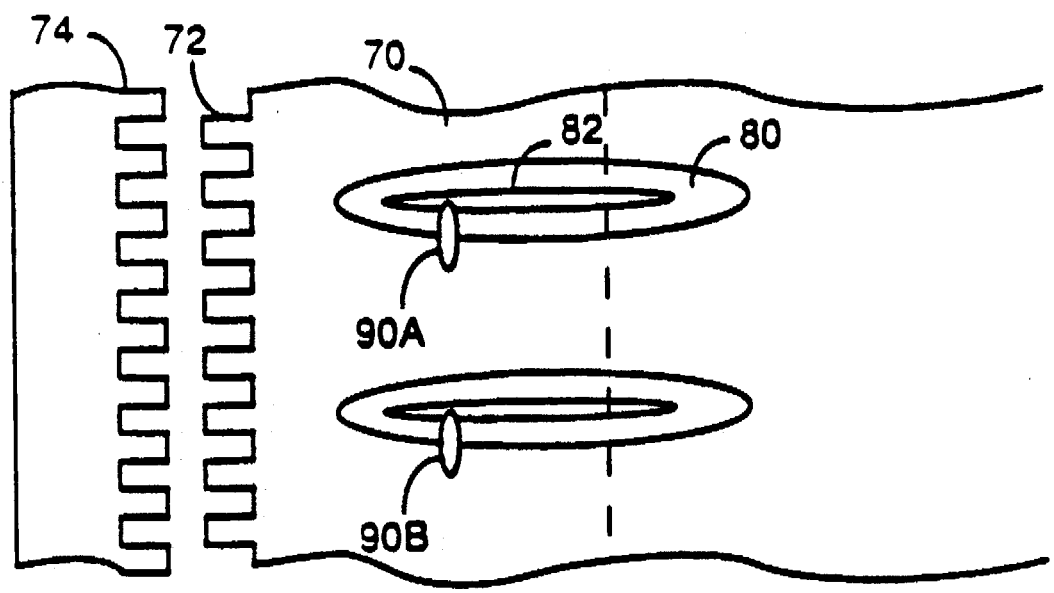
FIG. 5 is a detailed view of the power transient capacitors adjacent to the bond wire power pads.
Figure 6:
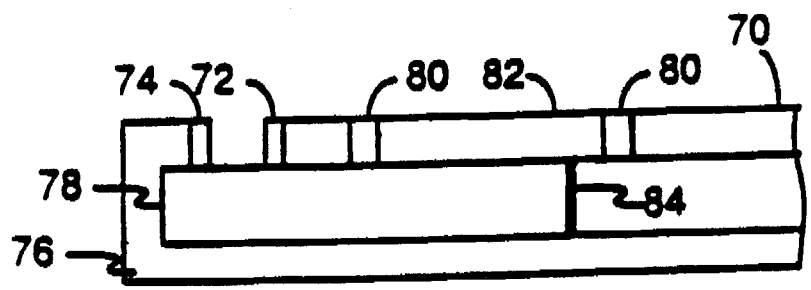
FIG. 6 is a cross-sectional view of the substrate beneath the power transient capacitors of FIG. 5.

FIGS. 5 and 6 show a more detailed view of the power tier 52 of FIG. 4. In particular, FIG. 5 depicts a power plane 70 which terminates in a number of power pads 72. Opposite the power pads 72 are a series of ground pads 74. As can be seen in FIG. 6, the ground pads 74 are coupled to a ground plane 76 which is wrapped beneath an insulating substrate 78. Returning to FIG. 5, the insulating substrate 78 forms an insulating island 80 in the power plane 70. At the center of the insulating island 80 is a ground island 82. As can be seen in FIG. 6, ground island 82 is established by providing electrical coupling means 84 from the ground island 82 to the ground plane 76 through the insulator 78.

To minimize the power transients conveyed to the power bond wires 58, capacitors 90 are provided between power planes 70 and the ground islands 82. In particular, the distance from the centerline of each capacitor 90 to the bondwire (not shown) on the bondpad 27 is less than ⅕ of an inch. The distance from the centerline of each capacitor 90 to the bondwire on the bondpad 27 is preferably ⅒ of an inch. This close distance greatly enhances high frequency decoupling. Prior art devices place decoupling capacitors on the exterior of the package.

Figure 7:
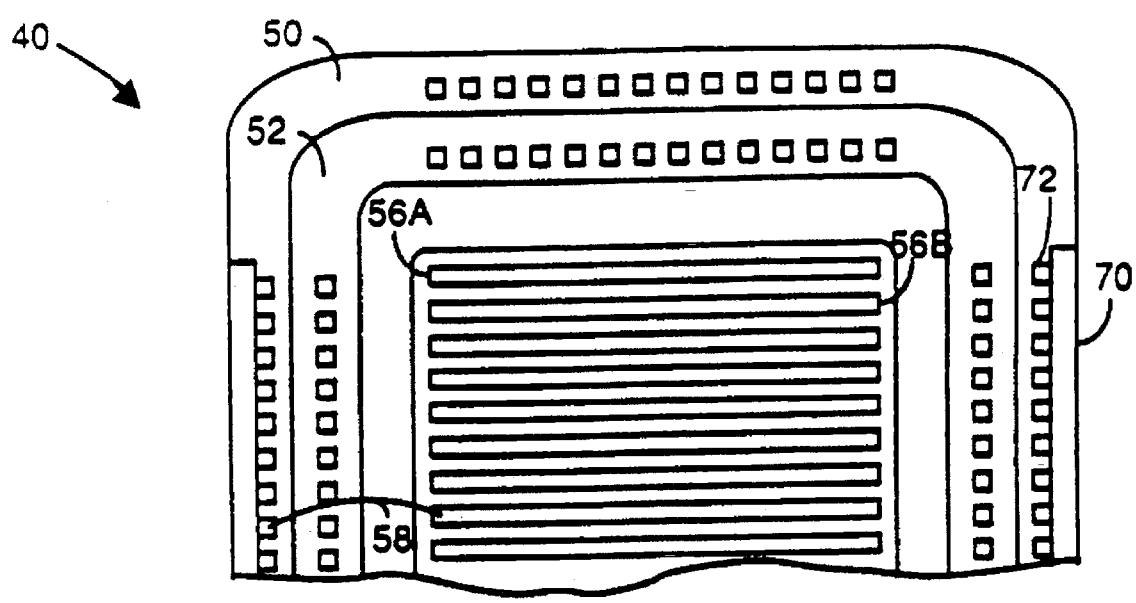
FIG. 7 is a plan view of the bus bars employed to uniformly distribute voltage.

The final power distribution technique associated with the package of the invention is disclosed in reference to FIG. 7. FIG. 7 is a simplified bottom view of the package aperture 43 of housing 40. The previously mentioned power pads 56 of the die 20 are more aptly described as "power bus bars". The power bus bars 56 of the invention are relatively thick conductors which extend the length of the die 20.

An ECL microprocessor may require that power and ground voltages be held within a 15 mV range over the entire chip. To minimize voltage variation, bus bars 56 are formed into an array of stripes that cross the narrow dimension of the die. In one embodiment, the stripes alternate between supply ($V_{ee}$=-5.2 V) and return ($V_{cc}$=ground) to minimize supply inductance and to bring power and ground close to every cell in the die. Each end of each bus bar 56 has a power bondwire 58, supplying half the stripe; the current crossing the middle of a stripe is zero.

The bus bars 56 are preferably formed of gold. The bus bars 56 may be formed by using known processes which are analogous to that used for tape automated bonding (TAB) bumps. In particular, standard gold bump plating processes may be used to produce gold features which are 25 microns thick, with spaces between bus bars as small as 38 microns. In one successful embodiment of the invention, the bus bars 56 are approximately 25 microns thick, there is a distance of approximately 38 microns between bus bars, and each bus bar is approximately 127 microns wide. The length of the bus bar is dependent upon the chip size.

The disclosure of the invention relied upon the example of ECL dies. One skilled in the art will recognize that in some applications these techniques are useful for other technologies such as GaAs or CMOS dies as well. In addition, one skilled in the art will recognize that many aspects of the invention are applicable to a package which substitutes a heatpipe for a thermosiphon. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A high powered die for use with a die package of the type which includes a housing with a central cavity forming an opening on a first side of said housing, said central cavity extending toward a second side of said housing where said high powered die is positioned, said die package further includes bond shelf means accessible to said high powered die through said central cavity for distributing signals and separate bond shelf means for distributing power and ground to said high powered die through bond wires coupled to said high powered die, said high powered die comprising:

semiconductor chip circuitry located on one or more surfaces of said high powered die, including at least one of said high powered die surfaces usable for power and ground distribution;

a plurality of discrete electrically isolated bus bars positioned on said one of said die surfaces for power and ground distribution, said plurality of bus bars extending from a first side of said high powered die to a second side of said high powered die, said plurality of discrete electrically isolated bus bars grouped into a first portion of said plurality of discrete electrically isolated bus bars, each having at least one ground connection to said die, and a second portion of said plurality of discrete electrically isolated bus bars, each having at least one power connection to said die, said first and second portions of said plurality of discrete electrically isolated bus bars being coupled at both said first and at said second side of said high powered die to said bond wires of said die package.

2. The high powered die of claim 1 wherein said plurality of discrete electrically isolated bus bars are conductors formed of gold and are approximately 25 micrometers thick and approximately 127 micrometers wide.

3. The high powered die of claim 1 wherein said plurality of discrete electrically isolated bus bars are conductors formed by a gold bump plating process.

* * * * *